United States Patent [19]
Ishikawa et al.

[11] Patent Number: 5,977,565
[45] Date of Patent: Nov. 2, 1999

[54] SEMICONDUCTOR LIGHT EMITTING DIODE HAVING A CAPACITOR

[75] Inventors: Masayuki Ishikawa; Koichi Nitta, both of Kanagawa-ken, Japan

[73] Assignee: Kabushiki Kaisha Toshiba, Kawasaki, Japan

[21] Appl. No.: 08/925,790

[22] Filed: Sep. 9, 1997

[30] Foreign Application Priority Data

Sep. 9, 1996 [JP] Japan ................................. 8-238070

[51] Int. Cl.⁶ .................................................. H01L 33/00
[52] U.S. Cl. ................................. 257/81; 257/84; 257/99
[58] Field of Search ................................. 257/81, 84, 98, 257/99, 91; 372/50

[56] References Cited

U.S. PATENT DOCUMENTS 5,479,029  12/1995  Uchida et al. .............................. 257/81

*Primary Examiner*—Minh Loan Tran
*Attorney, Agent, or Firm*—Banner & Witcoff, Ltd.

[57] ABSTRACT

A semiconductor light emitting diode having a high surge resistance and high reliability has a structure which includes an additional capacitor formed between an anode and a cathode of the light emitting element. Specifically, in an LED having an n-type GaN semiconductor layer, a GaN-based active layer and a p-type GaN-based semiconductor layer on a sapphire substrate, the cathode is formed on the n-type GaN semiconductor layer and an electrode wiring extends from the top of the p-type GaN-based semiconductor layer to form a capacitor.

36 Claims, 13 Drawing Sheets

SEMICONDUCTOR LIGHT EMITTING DIODE HAVING A CAPACITOR

BACKGROUND OF THE INVENTION

1. Field of the Invention

The present invention relates to a semiconductor light emitting element such as a light emitting diode (LED) or a semiconductor laser diode (LD), and more particularly relates to semiconductor light emitting elements having a capacitor, and a method for manufacturing the same.

2. Description of the Related Art

The semiconductor light emitting elements, such as LEDs and LDs, are manufactured having various wavelengths, luminance and light intensities dependent on the selection of semiconductor materials and structures of the elements.

FIGS. 12(a) and (b) show the structure of a conventional gallium nitride-based compound semiconductor ($In_xGa_yAl_{(1-x-y)}N$: $0 \leq x \leq 1$, $0 \leq y \leq 1$) LED (Japanese Patent Laid-Open Publication No. H6-338632). This LED has a structure in which an n-type compound semiconductor layer 112 and a p-type compound semiconductor layer 114 are sequentially deposited on a sapphire substrate 101. The p-type semiconductor layer 114 is partly etched to expose the n-type semiconductor layer 112. A cathode 105 is formed on the n-type semiconductor layer 112 and a translucent anode 107 made of a thin film metal is formed on the p-type semiconductor layer 114. After the wire bonding step, balls 161, 162 are formed on a base electrode 118 which is formed on the anode 107 and on the cathode 105. The current flows between the bonding wires 79, 78. The light is emitted by the recombination of the electrons and the holes on the pn-junction.

It was clarified by our experiments on the reliability of LEDs that deterioration of characteristics such as lowering of a luminous efficiency takes place when a high voltage is applied. For example, deterioration occurs when LEDs are touched by a person, soldered, plugged in or out, switched on or off, or impressed instantaneously with a high voltage (surge) generated by a drive circuit etc. Therefore, LED handling must be done with extreme care. Such disadvantages are noticeable with LEDs which have both the anode and the cathode on the same plane. Such disadvantages are noticeable with LEDs which have a transparent electrode formed of a thin film metal.

SUMMARY OF THE INVENTION

The present invention solves the above problems. The purpose of the present invention is to provide an LED and an LD which can be handled easily and do not deteriorate when a voltage surge takes place, and a method for manufacturing the LED and the LD.

An illustrative embodiment of the present invention provides a compound semiconductor light emitting device including a compound semiconductor light emitting element having a first electrode and a second electrode, and a capacitor element formed between the first electrode and the second electrode. The compound semiconductor light emitting element may include an $In_xAl_yGa_{(1-x-y)}N$ layer ($0 \leq x \leq 1$, $0 \leq y \leq 1$).

Another illustrative embodiment of the present invention provides a compound semiconductor light emitting device comprising a first compound semiconductor layer of a first conductivity type, a second compound semiconductor layer of a second conductivity type formed on the first compound semiconductor layer, a first electrode connected to the first compound semiconductor layer, a second electrode connected to the second compound semiconductor layer, and a capacitor formed between the first electrode and the second electrode. An active layer may be formed between the first compound semiconductor layer and the second compound semiconductor layer. A reflective layer may be formed under the first compound semiconductor layer. An insulating layer may be positioned between the first electrode and the second electrode, wherein the capacitor is a parallel plane capacitor formed among the second electrode, the insulating layer and the first electrode. The first electrode and the second electrode may serve as bonding pads. The capacitance of the capacitor may be greater than the intrinsic capacitance of the compound semiconductor light emitting element. A trench may be formed in the first compound semiconductor layer, the active layer and the second compound semiconductor layer, the capacitor being formed in the trench.

According to another illustrative embodiment of the present invention, a compound semiconductor light emitting device includes first and second wiring layers having an insulated overlap area, the capacitor being formed between the first and second wiring layers, the first wiring layer being connected to the first electrode and the second wiring layer being connected to the second electrode. The compound semiconductor light emitting element and the first and second wiring layers may be formed on a ceramic substrate.

Another illustrative embodiment of the present invention provides a compound semiconductor light emitting device comprising a wiring board having wiring lines on the surface thereof and a conductive paste for connecting the first electrode and the second electrode to the wiring lines.

According to another illustrative embodiment of the present invention, a compound semiconductor light emitting device comprises a first contact layer made of a first compound semiconductor layer of a first conductivity type, a first cladding layer made of a second compound semiconductor layer of the first conductivity type and formed on the first contact layer, an active layer formed on the first cladding layer, a second cladding layer made from a third compound semiconductor layer of a second conductivity type and formed on the active layer, a current block formed on the second cladding layer, a third cladding layer made from a fourth compound semiconductor layer of the second conductivity type, the third cladding layer being adjacent to the current block and formed on the second cladding layer, a second contact layer formed on the third cladding layer, a first electrode connected to the first contact layer, a second electrode connected to the second contact layer, an insulating layer formed between the first electrode and the second electrode, and a capacitor formed of elements including the first electrode, the insulator layer and the second electrode. The compound semiconductor light emitting device may further comprise a wiring board having wiring lines on the surface thereof, and a conductive paste for connecting the first electrode and the second electrode to the wiring lines.

Another illustrative embodiment of the present invention provides compound semiconductor light emitting device comprising a first contact layer made from a first compound semiconductor layer of a first conductivity type, a first cladding layer made from a second compound semiconductor layer of the first conductivity type and formed on the first contact layer, an active layer formed on the first cladding layer, a second cladding layer made from a third compound semiconductor layer of a second conductivity type on the active layer, a current block on the second cladding layer, a third cladding layer made from a fourth compound semiconductor layer of the second conductivity type and adjacent to the current block and formed on the second cladding layer, a second contact layer on the third cladding layer, a first electrode connected to the first contact layer, a second electrode connected to the second contact layer, and a capacitor formed between the first electrode and the second electrode. An insulating layer may be positioned between the first electrode and the second electrode, wherein the capacitor is a parallel plane capacitor formed among the first electrode, the insulating layer and the second electrode.

Another illustrative embodiment of the present invention provides a compound semiconductor light emitting device comprising a first contact layer made from a first compound semiconductor layer of a first conductivity type, a first cladding layer made from a second compound semiconductor layer of the first conductivity type and formed on the first contact layer, an active layer formed on the first cladding layer, a second cladding layer made from a third compound semiconductor layer of a second conductivity type on the active layer, a current block on the second cladding layer, a second contact layer made from a fourth compound semiconductor layer of the second conductivity type on the second cladding layer, a first electrode connected to the first contact layer, a second electrode connected to the second contact layer, and a capacitor formed between the first electrode and the second electrode.

Another illustrative embodiment of the present invention provides a method for manufacturing a compound semiconductor light emitting device, comprising the steps of forming a compound semiconductor light emitting element having a junction of a first compound semiconductor layer of a first conductivity type and a second compound semiconductor layer of a second conductivity layer wherein the first compound semiconductor layer is formed on a substrate and the second compound semiconductor layer is formed on the first compound semiconductor layer, etching the second compound semiconductor to partly expose the first compound semiconductor layer, forming a transparent electrode on the second compound semiconductor layer, forming a first electrode on the first compound semiconductor layer, forming an insulating layer on a portion of the first electrode, and forming an electrode wiring on the transparent electrode, extending to the top of the insulating layer.

According to an illustrative embodiment of the present invention, a method for manufacturing compound semiconductor light emitting device, comprises the steps of forming a buffer layer on a substrate, forming a first cladding layer on the buffer layer, forming an active layer on the first cladding layer, forming a second cladding layer on the active layer, removing a portion of the first cladding layer, the active layer and the second cladding layer to form a step-shaped portion, forming a transparent electrode on the second cladding layer, forming a first electrode on the first cladding layer at the bottom of the step-shaped portion, forming an insulating layer on a portion of the first electrode, and forming an electrode wiring on the second cladding layer, extending to the top of the insulating layer.

An illustrative method for manufacturing a compound semiconductor light emitting device according to the present invention comprises the steps of forming a reflecting layer on a substrate, forming a first cladding layer on the reflecting layer, forming an active layer on the first cladding layer, forming a second cladding layer on the active layer, removing a portion of the first cladding layer, the active layer and the second cladding layer to form a step-shaped portion, forming a second electrode on the second cladding layer, forming a first electrode on the first cladding layer at the bottom of the step shaped portion, forming an insulating layer on a part of the first electrode, and forming an electrode wiring on the second electrode, extending to the top of the insulating layer.

Another illustrative embodiment of the present invention provides a method for manufacturing a compound semiconductor light emitting device, comprising the steps of forming a buffer layer on a substrate, forming a first cladding layer on the buffer layer, forming an active layer on the first cladding layer, forming a second cladding layer on the active layer, forming a trench, the bottom of the trench being in the first cladding layer, by etching the second cladding layer, the active layer and a portion of the first cladding layer, forming a transparent electrode on the second cladding layer, forming an insulating layer on a surface of the trench, forming a contact hole through the insulating layer at the bottom of the trench, and forming an electrode on the insulating layer after the step of forming a contact hole.

Another illustrative embodiment of the present invention provides a method for manufacturing a compound semiconductor light emitting device, comprising the steps of forming a buffer layer on a substrate, forming a first cladding layer on the buffer layer, forming an active layer on the first cladding layer, forming a second cladding layer on the active layer, removing a portion of the first cladding layer, the active layer and the second cladding layer to form a step-shaped portion, forming a first electrode on the second cladding layer, forming an insulating layer on the first electrode, and forming a second electrode on the insulating layer connected to the first cladding layer at the bottom of the step-shaped portion.

Another illustrative embodiment of the present invention provides a method for manufacturing a compound semiconductor light emitting device, comprising the steps of forming a buffer layer on a substrate, forming a first contact layer on the buffer layer, forming a first cladding layer on the first contact layer, forming an active layer on the first cladding layer, forming a second cladding layer on the active layer, forming a current block on the second cladding layer, forming a second contact layer on the current block and the second cladding layer, removing a portion of the first contact layer, the first cladding layer, the active layer, the second cladding layer, the current block and the contact layer to form a step-shape portion, forming a first electrode on the first contact layer at the bottom of the step-shaped portion, forming an insulating layer on a part of the first electrode, and forming an electrode wiring on the second contact layer, extending to the top of the insulating layer.

Another illustrative embodiment of the present invention provides a method for manufacturing a compound semiconductor light emitting device, comprising the steps of forming a buffer layer on a substrate forming a first contact layer on the buffer layer, forming a first cladding layer on the first contact layer, forming an active layer on the first cladding layer, forming a second cladding layer on the active layer, forming a second contact layer on the current block, forming a ridge-shaped portion by etching the second cladding layer and the second contact layer, forming a current block on the ridge-shaped portion, forming a first electrode connected to the second contact layer on the current block, forming an insulating layer on the first electrode, and forming a second electrode connected to the first contact layer, on the insulating layer.

According to another illustrative embodiment of the present invention, a method for manufacturing a compound semiconductor light emitting device, comprises the steps of forming a buffer layer on a substrate, forming a first contact layer on the buffer layer, forming a first cladding layer on the first contact layer, forming an active layer on the first cladding layer, forming a second cladding layer on the active layer, forming a current block on the second cladding layer, forming a second contact layer on the current block and on the second cladding layer, removing a portion of the first contact layer, the first cladding layer, the active layer, the second cladding layer, the current block and the second contact layer to make a step-shaped portion, forming a first electrode on the contact layer, forming an insulating layer on the first electrode, and forming a second electrode on the insulating layer and on the first contact layer at the bottom of the step-shaped portion.

BRIEF DESCRIPTION OF THE DRAWINGS

The present invention will now be described in more detail with reference to preferred embodiments of the invention, given only by way of example, and illustrated in the accompanying drawings in which.

DETAILED DESCRIPTION OF THE PREFERRED EMBODIMENTS

Figure 1A:
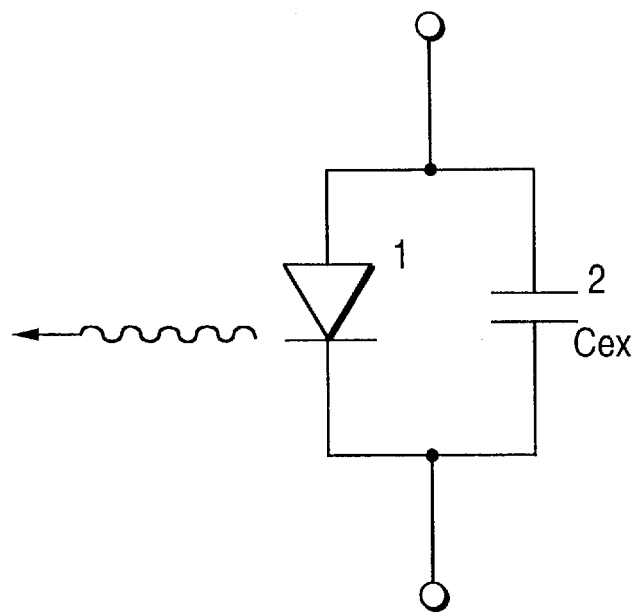
FIGS. 1(a) and 1(b) show an equivalent circuit for an LED according to an illustrative embodiment of the present invention.
Figure 1B:
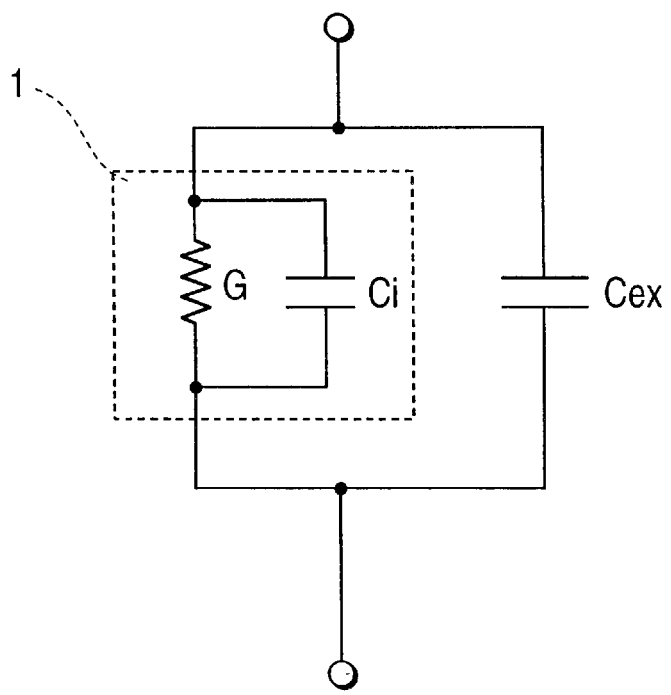
Figure 3:
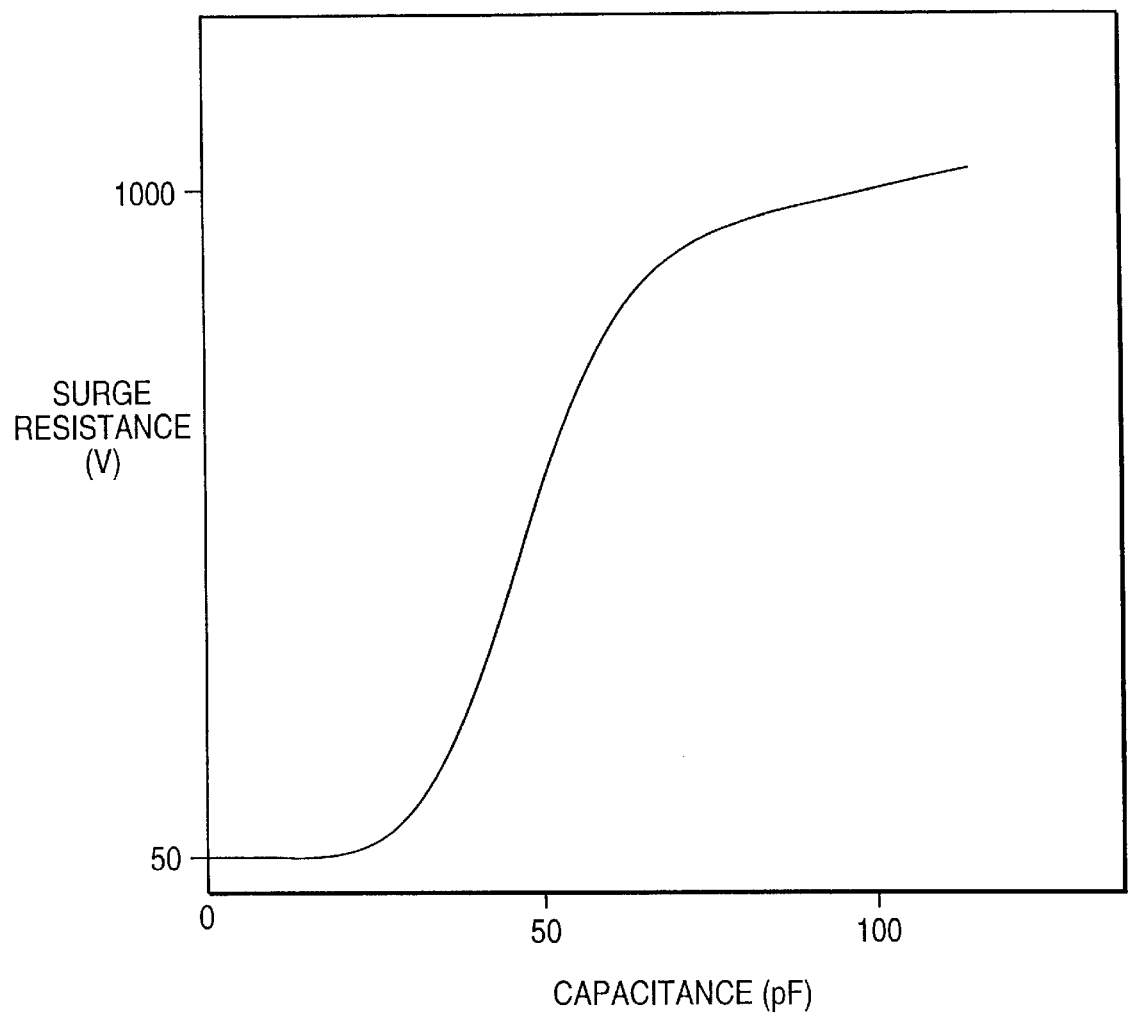
FIG. 3 is a graph showing the relationship between a capacitance Cex and a surge resistance.

As shown in FIG. 1 (a), according to a first feature of the present invention, a capacitor 2 is formed between the anode and the cathode of the semiconductor light emitting element 1 such as an LD or an LED. The capacitor 2 has a capacitance Cex which is equal to or larger than an intrinsic capacitance Ci within the semiconductor light emitting element 1. The intrinsic capacitance Ci of the semiconductor light emitting element 1 is expressed by an equivalent conductance G and an equivalent capacitance Ci and is a general term for the pn-junction capacitance and other floating capacitance. In other words, when the impedance of the semiconductor light emitting element 1 is measured, the capacitance Ci is determined separately from the equivalent conductance G. When the capacitance Cex of the capacitor 2 is almost equal to Ci or several times larger than Ci, the surge resistance improves as shown in FIG. 3. This results because the total capacitance of the LED is increased by the parallel connection of an additional capacitance Cex between the cathode and the anode of the semiconductor light emitting element. The response of the current against the instantaneous voltage becomes moderate, and the degradation of characteristics of the LED is suppressed due to the metal migration or the increase of defects resulting from a large current.

Figure 4:
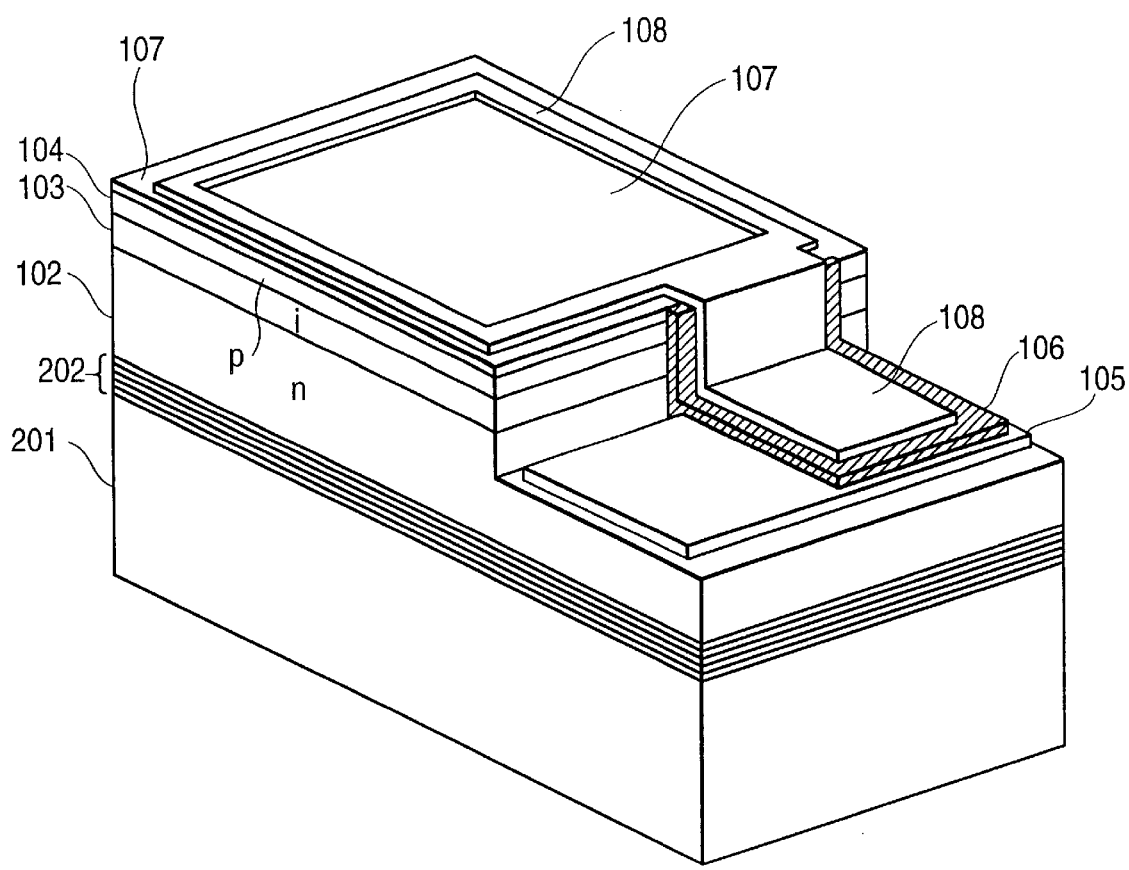
FIG. 4 shows an LED structure having a multiple reflection layers according to a second illustrative embodiment of the present invention.
Figure 5:
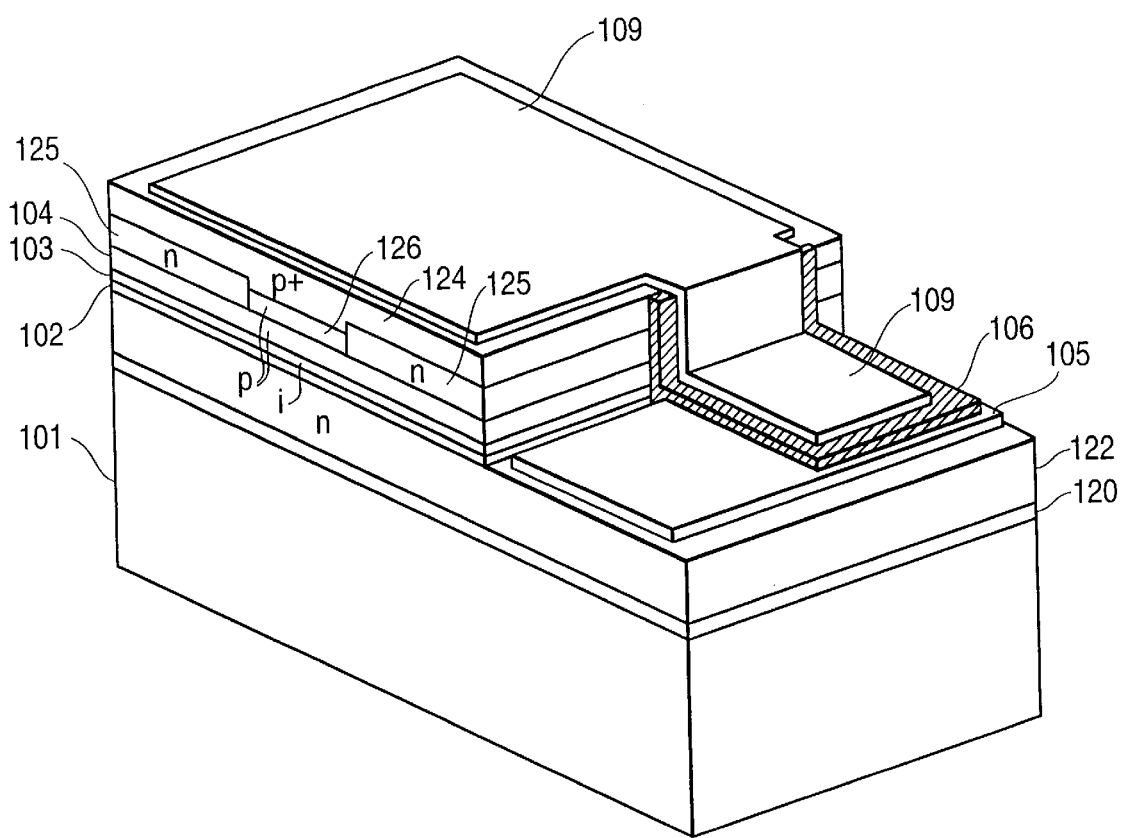
FIG. 5 shows a structure of an LD according to a third illustrative embodiment of the present invention.
Figure 7:
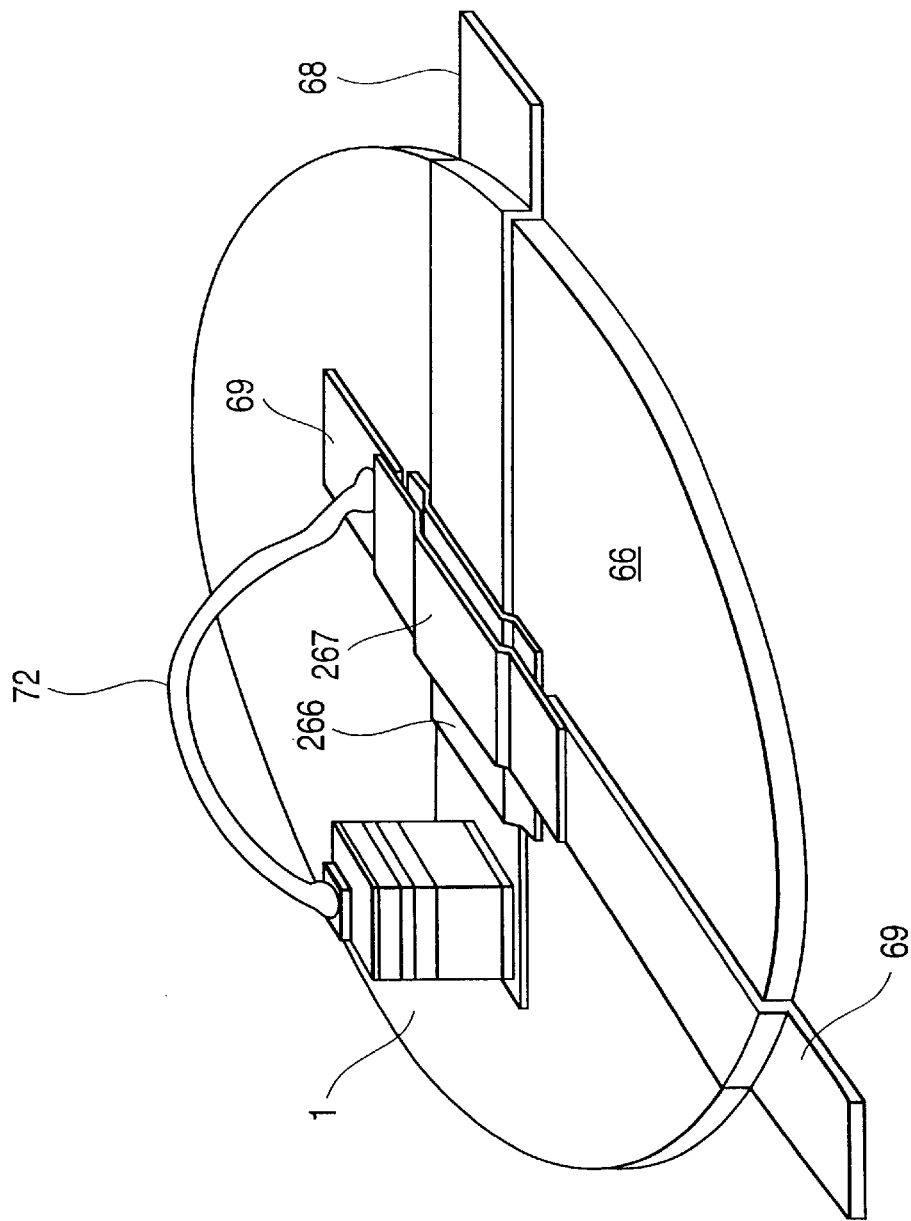
FIG. 7 shows a capacitor Cex arranged on a package according to a fifth illustrative embodiment of the present invention.

As shown in FIG. 2, FIG. 4 and FIG. 5, the additional capacitor Cex can be formed by a parallel plane capacitor which includes a first electrode 105, an insulating layer 106 and an electrode wiring 108 extending from the top of a transparent electrode on a bottom of a step shaped portion. Alternatively, the present invention may be configured by connecting an external capacitor Cex between leads of the lead frame or wiring layers on a package as shown in FIG. 7. In any event, the object of the present invention can be achieved when the additional capacitance is formed between the first electrode and the electrode wiring.

Embodiment 1

Figure 2A:
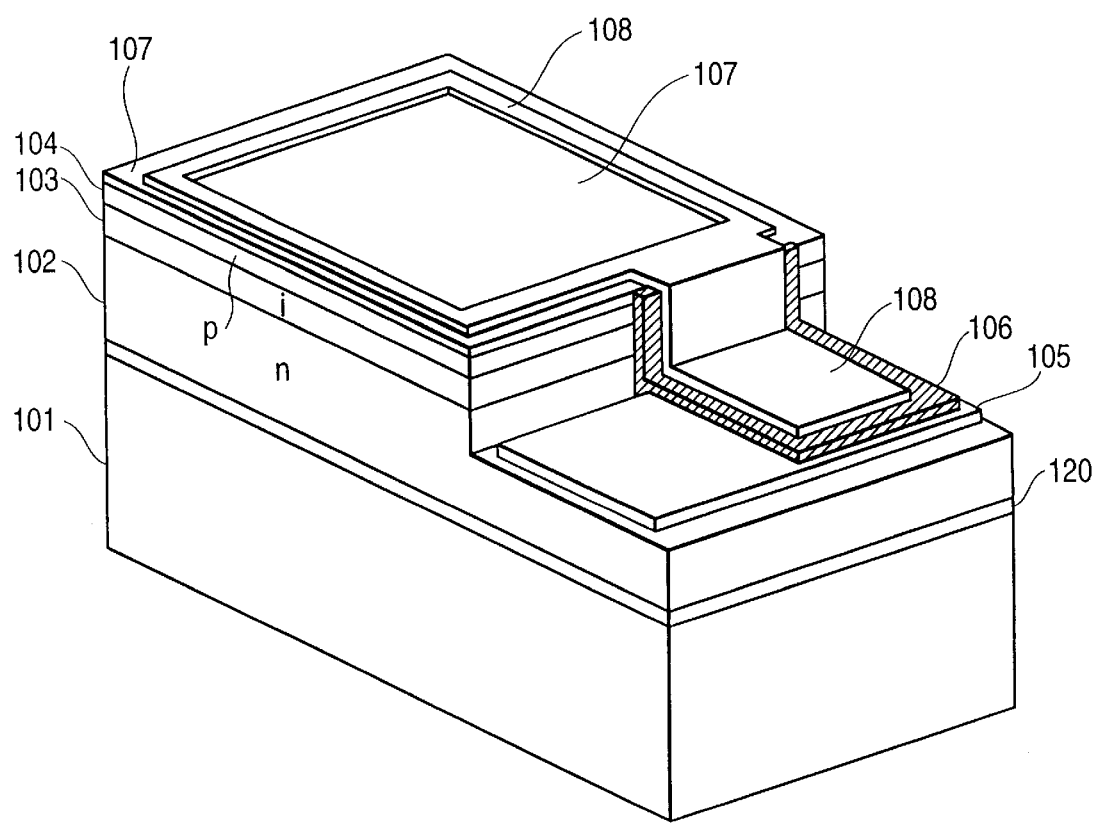
FIG. 2(a) shows a perspective view of an LED according to a first illustrative embodiment of the present invention.
Figure 2C:
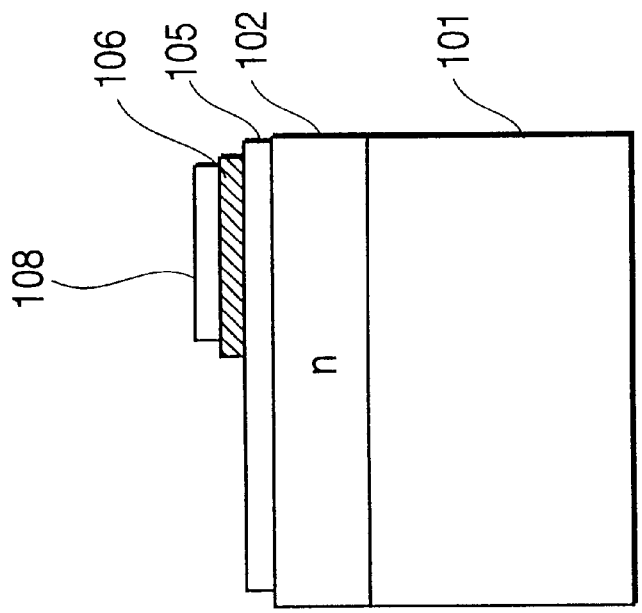
FIG. 2(c) shows a sectional view of the LED according to the first illustrative embodiment.
Figure 2B:
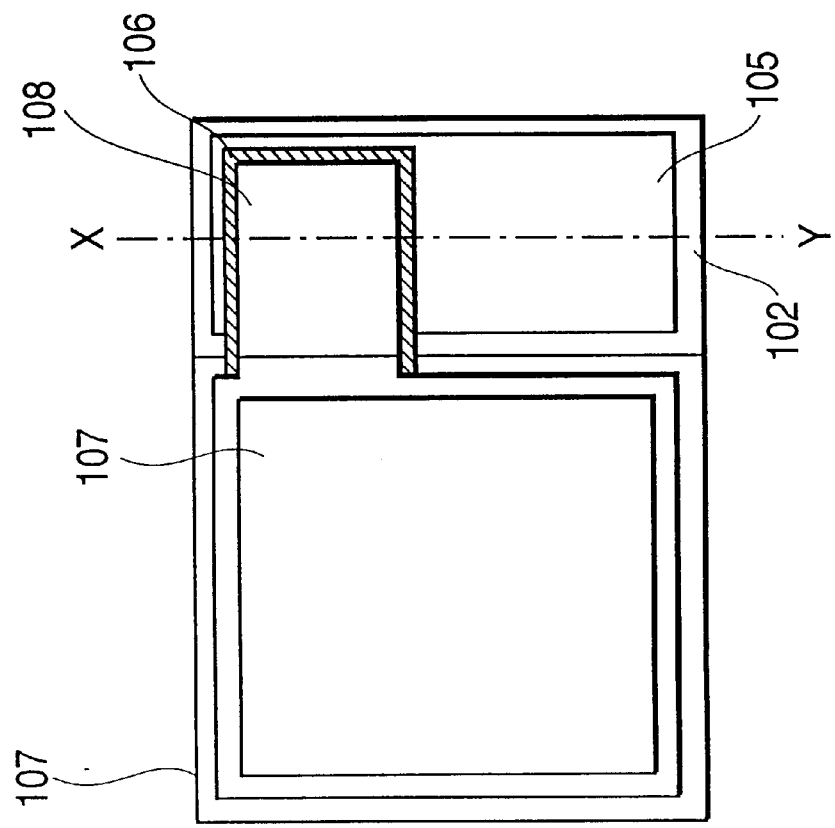
FIG. 2(b) shows a plan view of the LED according to the first illustrative embodiment.

FIG. 2(a) is a perspective view of a short wavelength semiconductor light emitting element according an illustrative embodiment of the present invention, and FIG. 2(b) is a plan view of the LED of FIG. 2(a). FIG. 2(c) is a sectional view along the line X-Y of FIG. 2(b).

Referring to FIGS. 2(a)–(c), a short wavelength semiconductor light emitting element has a first cladding layer 102 of an n-type gallium nitride-based (GaN-based) semiconductor, having a thickness of about 2–6 $\mu$m, an active layer 103 of a Ga-based semiconductor, and a second cladding layer 104 of a p-type Ga-based semiconductor, having a thickness of about 0.4 $\mu$m. The first cladding layer 102 is on a buffer layer 120 having a thickness of 10–200 nm which is on a sapphire substrate 101. The second cladding layer 104 can have a thickness of about 0.1–1 $\mu$m. The active layer 103 is formed by, for example, thin GaN layers and thin InGaN layers alternately. The active layer 103 can include one or more pairs of a thin GaN layer and a thin InGaN layer, and an additional thin GaN layer. Thus, both sides of the active layer 103 are thin GaN layers. The thin GaN layers have a thickness of about 1–10 nm, typically 4 nm. The InGaN layers have a thickness of about 1–5 nm, typically 2 nm. Therefore, when the active layer 103 includes five pairs of the thin GaN layer having the typical thickness, the thickness of the active layer 103 is 34 nm.

By partly etching the second cladding layer 104, the active layer 103 and a small portion of the first cladding layer 102, a step having a substantially vertical side wall is formed. A first electrode 105 is formed on the first cladding layer 102 at the bottom of the step. A transparent electrode 107, which is an anode in this embodiment, is formed on the top of the second cladding layer 104. A frame-shaped electrode wiring 108 is formed on the transparent electrode 107. The transparent electrode 107 includes, for example, an indium tin oxide (ITO) or $SnO_2$, or a translucent thin layer of Ni or Au or an alloy of Ni and Au. The electrode wiring 108 is a metal layer such as Ti Au, Ni, an alloy of Au and Ti, an alloy of Al or an alloy of Cu, and is formed to expose the transparent electrode 107 as much as possible to increase an area for the emitted light. The light is emitted through the portion of the transparent electrode 107 not shielded by the electrode wiring 108.

An insulating layer 106, e.g., SiO$_2$, is formed on the first electrode 105. An electrode wiring 108 extends from the top of the transparent electrode 107 to the bottom of the step where the first electrode 105 is formed. Thus, a capacitor (parallel plane type capacitor) Cex is formed among the electrode wiring 108, the insulating layer 106 and the first electrode 105. The electrode wiring 108 and the first electrode 105 on the bottom of the step work also as a bonding pad, and lines of Au and other materials can be bonded.

The surge resistance can vary depending on the material or the thickness of the insulating layer 106 or the overlapped area between the first electrode 105 and the electrode wiring 108. The total capacitance of the LED increases because the capacitance Cex adds to the inherent capacitance Ci. The increased capacitance prevents the instantaneous large voltage from attacking the pn-junction of the light emitting element. Thus, the metal migration and the characteristic degradation can be suppressed well.

The insulating layer 106 has a preferred thickness of about 0.01–1 μm for SiO$_2$, which has a relative dielectric constant $\epsilon_r$ of about 3.9, when the area of the overlapped electrodes is about 100 μm$^2$. The insulating layer 106 has a preferred thickness of less than or equal to 0.1 μm. When the insulating layer 106 has a high dielectric constant such as with BaTiO$_3$ (BTO) or SrTiO$_3$ (STO), the surge resistance can improve even if a thick insulating layer is used. Since the thickness of the insulating layer 106 cannot be decreased over a predetermined thickness because of the break down voltage, it is advantageous to use a material having a high dielectric constant such as BTO or STO.

As shown in FIG. 3, the surge resistance improves as the capacitance Cex increases. In the case that an LED has a surge resistance of about 50V when Cex=0, the surge resistance improves to 500V when Cex=50 pF and to about 1000V when Cex=100 pF. However, it is obvious that the surge resistance does not exceed the breakdown voltage of the insulating layer even if the capacitance Cex is increased. In view of specific mounting technique or the cost of an LED, an overlapped area of the electrode wiring 108 on the bottom of the step, namely the area of the capacitor Cex, may be about 100 μm$^2$. Therefore, it is preferable for the capacitance Cex to be several times greater than the Ci, since an improvement in the surge resistance can be realized when the capacitance Cex is about two or three times of the capacitance Ci.

In the first embodiment of the present invention, an In$_x$Al$_y$Ga$_{(1-x-y)}$N compound semiconductor is used for a GaN-based semiconductor. According to the x and y components, the wavelength of the emitting light varies widely, e.g., green, greenish blue, blue and ultraviolet (UV). The components x, y meet the criteria of $0 \leq x \leq 1$, $0 \leq y \leq 1$.

The first cladding layer 102 can be the n-type In$_x$Al$_y$Ga$_{(1-x-y)}$N layer of the pn-junction for an emitting light plane in this embodiment, which can be doped with impurities such as silicon (Si) or selenium (Se) at an impurity concentration of about $3 \times 10^{18}$cm$^{-3}$. The impurity concentration may be $5 \times 10^{17}$cm$^{-3}$–$2 \times 10^{20}$cm$^{-3}$, preferably between $5 \times 10^{18}$cm$^{-3}$–$5 \times 10^{19}$cm$^{-3}$. The parameters x and y satisfy $0 \leq x \leq 1$ and $0 \leq y \leq 1$, and preferably are $0 \leq x \leq 0.3$ and $0 \leq y \leq 1$ for a desired wavelength.

The active layer 103 may be a substantially intrinsic semiconductor layer, that is an undoped layer, formed by In$_x$Al$_y$Ga$_{(1-x-y)}$N, which is the center of the emitting light plane. The parameters x and y of the active layer 103 satisfy $0 \leq x \leq 1$ and $0 \leq y \leq 1$, and preferably are $0 \leq x \leq 0.5$ and $0 \leq y \leq 0.6$, for a desired wavelength.

The second cladding layer 104 can be an In$_x$Al$_y$Ga$_{(1-x-y)}$N layer, which is the p-type layer of the pn-junction for the emitting light plane, which can be doped with impurities such as magnesium (Mg), beryllium (Be) or zinc (Zn) at an impurity concentration of about $3 \times 10^{18}$cm$^{-3}$. The parameters x and y satisfy $0 \leq x \leq 1$ and $0 \leq y \leq 1$, and preferably are $0 \leq x \leq 0.3$ and $0 \leq y \leq 1$, for a desired wavelength, corresponding with the first cladding layer 102 and the active layer 103.

The buffer layer 120 of In$_x$Al$_y$Ga$_{(1-x-y)}$N between the sapphire substrate 101 and the first cladding layer 104 is not necessary. However, when the buffer layer 120 is formed, the crystal quality of the light emitting plane improves, so that highly efficient luminescence can be provided.

An n-type contact layer of n-type In$_x$Al$_y$Ga$_{(1-x-y)}$N having a high impurity concentration, may be formed between the buffer layer 120 and the first cladding layer 102. The first electrode 105 can be formed on the first contact layer. When a p-type contact layer of p-type In$_x$Al$_y$Ga$_{(1-x-y)}$N having a high impurity concentration is formed between the transparent electrode 107 and the second cladding layer 104, an ohmic contact resistance decreases, so that luminous efficiency improves.

When a material having a high dielectric constant such as BTO or STO is used for the insulating layer 106, the insulating layer 106 can be patterned by the well-known ion milling method with Ar ion etc.

In the above embodiment the compound semiconductor light emitting device is SH type, but DH type can be applicable. When the LED has a DH structure, the active layer 103, which has a smaller energy gap Eg than the first cladding layer 102 and the second cladding layer 104, is formed between the first cladding layer 102 and the second cladding layer 104 as shown in FIG. 2(a).

An illustrative method for producing an LED according to the first embodiment of the present invention is shown in FIGS. 2(a)–(c).

A thin buffer layer 120 of In$_x$Al$_y$Ga$_{(1-x-y)}$N is formed having a thickness of about 10–200 nm, preferably 50 nm, on a (0001) face sapphire substrate 101 having a predetermined thickness. A first cladding layer 102 of n-type In$_x$Al$_y$Ga$_{(1-x-y)}$N, an active layer 103 of undoped In$_x$Al$_y$Ga$_{(1-x-y)}$N and a second cladding layer 104 of p-type In$_x$Al$_y$Ga$_{(1-x-y)}$N are successively deposited on the thin buffer layer 120 by, for example, the metal organic chemical vapor deposition (MOCVD) method. When the low pressure MOCVD method is applied, for example, Ga(CH$_3$)$_3$, In(CH$_3$)$_3$, Al(CH$_3$)$_3$ and NH$_3$ are used as a reactive gas and introduced together with a carrier gas consisting of hydrogen or nitrogen. A reaction pressure is, for example, about 1–10 KPa. An atmospheric pressure MOCVD may also be used. Thus, the layers of a GaN-based semiconductor from the thin buffer layer 120 to the second cladding layer 104 can be successively grown. The thin buffer layer 120 and the first cladding layer 102 fuse together. The composition ratio of the respective layers can be adjusted by changing the component ratio of each reaction gas. SiH$_4$ or bicyclopentadienylmagnesium (CP$_2$Mg) may be used appropriately to dope impurities.

The sapphire substrate 101 on which the compound semiconductor layers from the first cladding layer 102 to the second cladding layer 104 are successively grown is taken out from the CVD chamber, and an insulating layer (e.g., SiO$_2$ layer) is formed on the second cladding layer 104 by, illustratively, the sputtering method or the CVD method. After a photo-resist pattern layer is formed on the insulating layer by, for example, the conventional photolithography method, the insulating layer is selectively etched. Using a two-layer mask consisting of the selectively etched insulating layer and the photo-resist pattern layer as an etching mask, a step is formed by removing partly the second cladding layer 104, the active layer 103 and a shallow portion of the first cladding layer 102 with the conventional etching method, so that the first cladding layer 102 is exposed on the bottom of the step. When the n-type contact layer is formed under the first cladding layer 102, the first cladding layer 102 is removed by etching successively and the n-type contact layer is exposed.

After removing the two-layer mask by, for example, the conventional etching method, the substrate is washed. The second electrode layer (e.g., ITO layer) is deposited on the second cladding layer 104 by the sputtering or the CVD method. Using, for example, the lift-off method, the transparent electrode 107 can be shaped by removing the useless part thereof.

Next, the substrate is washed. Then, a metal such as Ti, Al or Ni for the first electrode layer is deposited on the whole area by the sputtering method or the evaporation method. The first electrode 105 is patterned on the bottom of the step by removing the useless part of the first electrode layer by the photolithography method or the lift-off method. A photo-resist pattern is formed before depositing the first electrode layer when the lift-off method is applied.

An $SiO_2$ layer is deposited by the CVD method at a temperature of 380–400° C. or lower. It is preferable to use the plasma CVD method or the photo CVD method because the deposition can be carried out at a temperature of 150° C. or below. The $SiO_2$ layer on the transparent electrode 107 and on a part of the first electrode 105 can be selectively removed by the photolithography method or the RIE method. When the RIE method is applied, the $SiO_2$ layer remains on the side wall of the step because of the strong directivity. The $SiO_2$ layer on the side wall of the step is removed in FIG. 2(a), but it may remain on the surface of the side wall of the step.

After a metal layer of Ti or Au, or an alloy metal of Ti and Au etc. is deposited by the sputtering method or the electron beam (EB) deposition method, the electrode wiring 108 is patterned in the shape of a frame as shown in FIG. 2(a) by the photolithography method and the RIE method. If the $SiO_2$ layer remains on the surface of the side wall of the step, the metal layer may be formed on the surface of the side wall of the step.

After forming the basic structure of short wavelength LEDs on a wafer they are appropriately sized by the diamond cutter or the like to obtain plural light emitting elements. A short wavelength LED according to this embodiment of the invention is obtained after the element is mounted on leads, wire-bonded and molded.

When a high dielectric material or a strong dielectric material such as $Ta_2O_5$, $SrTiO_3$(STO), $BaTiO_3$(BTO), $BaSrTiO_3$(BSTO) or $PbZr_xTi_{(1-x)}O_3$ (PZT) is applied as the insulating layer 106, the surge resistance further improves because a larger capacitance Cex can be obtained while maintaining the insulating layer thickness.

Embodiment 2

FIG. 4 shows a double hetero-type (DH) LED structure provided with a reflection multilayer (the Bragg reflection multilayer) according to the present invention. In FIG. 4, a semiconductor reflection multilayer 202 is formed on an n-GaAs substrate 201. The reflection multilayer 202 has a periodic structure of a high refractive index layer of n-type $(Al_{0.5}Ga_{0.5})_{0.5}In_{0.5}P$, and a low refractive index layer of n-type $Al_{0.5}In_{0.5}P$, at each thickness of $\lambda/4n$ where $\lambda$ is the wavelength of the emitted light and n is the refractive index. A DH structure is formed on the reflection multilayer 202. The DH structure has a first cladding layer 102 which is an n-type $Al_{0.5}In_{0.5}P$ layer, an active layer 103 which is an undoped $(Al_{0.45}Ga_{0.55})_{0.5}In_{0.5}P$ layer and a second cladding layer 104 which is a p-type $Al_{0.5}In_{0.5}P$ layer. On the second cladding layer 104, a transparent electrode 107, which can be an ITO layer or a thin layer of Ni, Au, or a Ni-Au alloy, is formed. A step having a substantially vertical sidewall is formed by partly etching the second cladding layer 104, the active layer 103 and a shallow portion of the first cladding layer 102. A first electrode 105 of an AuGe alloy is formed on the first cladding layer 102 at the bottom of the step to connect electrically to the first cladding layer 102. A frame-shaped electrode wiring 108 of a metal such as Ti, Au, Ni, an Au-Ti alloy, an Au-Al, or an Au-Cu alloy is further formed on the transparent electrode 107. The light is emitted through the portion of the transparent electrode 107 except for the area of the transparent electrode covered by the electrode wiring 108.

An insulating layer 106 of $SiO_2$ is formed on the first electrode 105. The electrode wiring 108 extends from the top of the transparent electrode 107 to the top of the insulating layer 106 through the side wall surface of the step. Thus, a capacitor Cex is formed by the electrode wiring 108, the insulating layer 106 and the first electrode 105. The surfaces of the electrode wiring 108 at the bottom of the step and the exposed first electrode 105 work as a bonding pad, and are bonded by an Au line etc.

The surge resistance improves because the capacitance of the diode as a whole increases by forming a capacitor Cex on the light emitting element. When the capacitance Cex is about ten times greater than the inherent capacitance Ci, the surge resistance is about ten times greater than the inherent resistance of the LED. The insulator layer 106 is preferred to have a thickness of about $0.01–1$ $\mu m$ for $SiO_2$, but it can have a thickness of $1$ $\mu m$ or more by using a high dielectric material such as BSTO, BTO or STO. When BSTO is to be used, W is available for the electrode wiring 108. After the W layer is patterned by the RIE with $CF_4$ or the ion milling method directly, the BSTO layer is etched using the patterned W layer as the mask with a mixed solution of hydrogen peroxide, ammonia and ethylenediaminetetraacetic acid EDTA).

The second embodiment of the present invention is not limited to an InGaAlP-based LED, but can also be applied to a GaAlAs-based and other LEDs regardless of homo-junction, single heterojunction (SH junction) or DH junction types.

Embodiment 3

FIG. 5 is a perspective view showing the outline of a blue semiconductor laser according to a third illustrative embodiment of the invention. As shown in FIG. 5, the blue ID has a first contact layer 122 of n-type GaN having a thickness of 10–200 nm, a first cladding layer 102 of n-type GaN is formed on a sapphire substrate 101 having a (0001) surface, and an active layer 103 of undoped $In_xGa_{(1-x)}N$ formed on the first cladding layer 102. A second cladding layer 104 of p-type GaN is formed on the active layer 103, and current block layers 125 of n-type GaN are formed on the second cladding layer 104. A third cladding layer 126 of p-type GaN is formed between the current block layers 125 on the second cladding layer 104. A contact layer 124 of p+ GaN is formed on the third cladding layer 126 and the current block layers 125.

A step having a substantially vertical sidewall is formed by partly etching the contact layer 124, the current block layer 125, the second cladding layer 104, the active layer 103, the first cladding layer 102 and a shallow portion of the first contact layer 122. A first electrode 105 of Ti, Au or an alloy thereof is formed on the first contact layer 122 at the bottom of the step to connect electrically to the first contact layer 122. An insulating layer 106 of $SiO_2$ or the like is formed on the first electrode 105 and the wall of the step. A second electrode 109 of a metal such as Ni, Au, Ti, an alloy of Au and Ti, an alloy of Au and Al, or an alloy of Au and Cu is formed on the contact layer 124 and extends to the bottom of the step through the surface of the sidewall of the step.

A capacitor Cex includes the second electrode 109, the insulating layer 106 and the first electrode 105 on the bottom of the step. When the capacitance Cex has a value of about ten times greater than the internal capacitance Ci of the LD, the surge resistance becomes about ten times greater than that of the conventional LD. When a high dielectric material or strong dielectric material such as BTO or PZT is selected as the insulating layer 106, a surge resistance of several kV or more can be obtained.

Embodiment 4

Figure 6A:
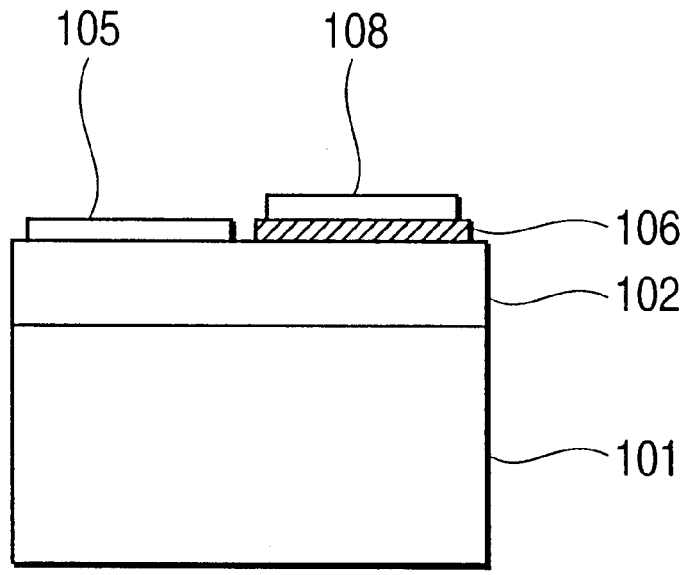
FIGS. 6(a) and 6(b) show examples of structures of a capacitor Cex according to a fourth illustrative embodiment of the present invention.
Figure 6B:
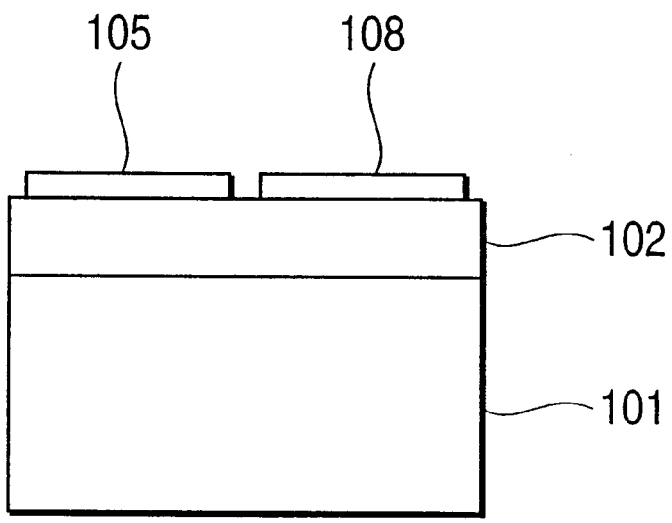

FIGS. 6(a)–(b) show a fourth embodiment of the present invention illustrating another structure of a capacitor Cex. In addition to the type of capacitor Cex formed by the sandwich structure (the parallel plane capacitor) with the electrode wiring 108, the insulating layer 106 and the first electrode 105 as explained in the first to third embodiments, as shown in FIG. 6(a), another type of capacitor Cex can include the first electrode 105 connected to a first semiconductor layer 102 of a first conductivity type and the electrode wiring 108 on an insulating layer 106 on the first semiconductor layer 102. As shown in FIG. 6(b), the capacitor Cex can include the first electrode 105 connected to a first semiconductor layer 102 of a first conductivity type and the electrode wiring 108 on the first semiconductor layer 102. In this instance, and the metal-semiconductor junction structure is formed between the electrode wiring 108 and the first semiconductor layer 102. Namely, FIGS. 6(a)–(b) show a structure in which the electrode wiring 108 and the first electrode 105 are formed on a different part on the surface of the first semiconductor layer 102. FIG. 6(a) shows a MOS type capacitor, and FIG. 6(b) illustrates a Schottky junction type capacitor depending on the selection of materials of the electrode wiring 108.

When the capacitor Cex is desired to have a large capacitance, a trench type capacitor used for a DRAM may be applied. Namely, after a trench is formed within the n-type semiconductor layer 102, a capacitor is formed in the trench. In other words, the capacitor of the present invention is not limited to the parallel plane capacitor, but may have a cylindrical or another form. The first electrode 105 and/or the electrode wiring 108 may serve as wiring lines to the other elements.

Embodiment 5

FIG. 7 shows a capacitor Cex formed on a ceramics package 66 of alumina according to an exemplary embodiment of the present invention. A first Cu wiring 68 having a thickness of about 0.1–0.2 mm is sintered (directly connected) to an alumina substrate 66 and its surface is plated with Au at a thickness of about 5–20 $\mu$m. A semiconductor light emitting element 1 such as an LED or an LD is mounted on the first Cu wiring 68 and a cathode of the light emitting element 1 is connected to the first Cu wiring 68. A second Cu wiring 69 plated with Au is also directly connected to the alumina substrate 66, but for the part that crosses the first Cu wiring 68 at right angles which is insulated by an $SiO_2$ layer 266. On the $SiO_2$ layer 266, an Al bridge layer 267 is formed having a thickness of about 10 $\mu$m. Another metal thin film, for example, Au, may be used as the bridge layer. The bridge layer 267 and the second Cu wiring 69 are electrically insulated from the first Cu wiring 68. An anode of the light emitting element 1 is connected to the second Cu wiring 69 by a bonding wire 72. The first and second Cu wirings 68, 69 serve as leads (external electrode). The capacitor Cex is formed by the bridge layer 267, the $SiO_2$ layer 266 and the first Cu wiring 68. The area of the capacitor Cex and the thickness of the $SiO_2$ layer 266 can be designed with extensive flexibility. The value of Cex can be selected as desired regardless of the structure of the light element 1, so that a surge resistance of 1000V or more can be achieved with ease.

Further, in the case that a semiconductor light emitting element 1 such as an LED or an LD is mounted on a conventional lead frame and the one end of the leads of the lead frame is connected to the anode and the other end of the leads of the lead frame is connected to the cathode of the light emitting element, the capacitance Cex can increase due to forming a capacitor between the leads of the lead frame. For example, the leads of the lead frame have plane parts facing each other or a condenser therebetween.

The structures of FIG. 7 can also be applied to a structure when the anode and the cathode of the light emitting element are formed on the same side. Therefore, the fourth embodiment of the invention can be applied regardless of the arrangement of the anode and the cathode. In other words, the fourth embodiment can be extensively applied to any light emitting elements.

As described above, the present invention can prevent LEDs or LDs from deterioration caused by the surge resistance and can provide a highly reliable light emitting device.

Embodiment 6

Figure 8:
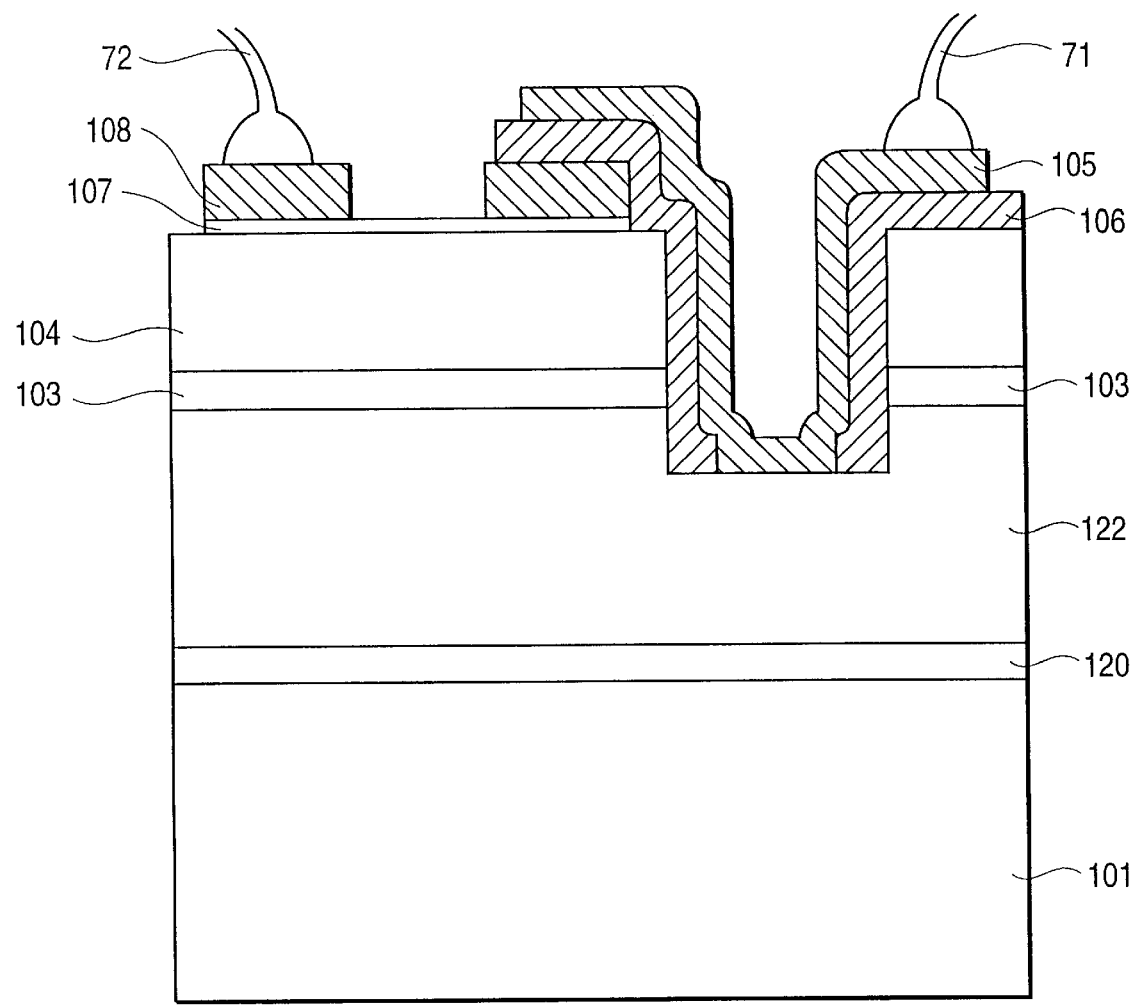
FIG. 8 shows a sectional view of an LED with a trench capacitor according to a sixth illustrative embodiment of the present invention.

FIG. 8 shows an exemplary LED structure having a trench capacitor according to the present invention. A buffer layer 120 of InAlGaN having a thickness of 10–200 nm is formed on a sapphire substrate 101. A DH structure has a first contact layer 122 which is an n-type CaN (doped with Si, for example) layer at a thickness of about 4 $\mu$m on the buffer layer 120, an active layer 103 which includes a well layer of $In_{0.3}Ga_{0.7}N$ doped with Si at a thickness of about 2.5 nm and a cap layer of a p-$Al_{0.2}Ga_{0.8}N$ layer at a thickness of about 40 nm, and a second contact layer 104 which is a p-type GaN layer doped with Mg at a thickness of 0.5 $\mu$m. A trench reaching the first contact layer 122 is formed by, for instance, RIE.

On the second contact layer 104, a transparent electrode 107, for example, an ITO layer, Ni layer, an Au layer, or an Ni-Au alloy, is formed. A electrode wiring 108 of a metal such as Ti, Au, Ni, an Au-Ti alloy, an Au-Al alloy, or an Au-Cu alloy is further formed on the transparent electrode 107.

An insulating layer 106 of $SiO_2$ is formed on the trench surface. After forming a contact hole through the insulating layer 106 at the bottom of the trench, a first electrode 105 of an AuGe alloy is formed on the insulating layer 106. A hole is formed in the electrode wiring 108 so that the light emitted from the active layer 103 passes through the hole. Bonding wires 71, 72 are bonded to the first electrode 105 and the electrode wiring 108. Thus, a capacitor Cex is formed by the electrode wiring 108, the insulating layer 106 and the first electrode 105 in the trench.

The surge resistance improves because the capacitance of the diode as a whole is increased by forming a capacitor Cex on the light emitting element. When the capacitance Cex is about ten times greater than the inherent capacitance Ci the surge resistance is about ten times greater than the inherent resistance of the LED. The trench type capacitor can form a large capacitance and the manufacturing yield improves because the manufacturing process is easy. The insulator layer 106 preferably has a thickness of about 0.01–1 µm for SiO$_2$, which can be 1 µm or more by using a high dielectric material such as BSTO, BTO or STO. When BSTO is be used, W is available for the electrode wiring 108.

This embodiment according to the present invention is not limited to the GaN-based LED, but applies to other LEDs regardless of homo-junction, single hetero-junction (SH junction) or DH junction types.

Embodiment 7

Figure 9:
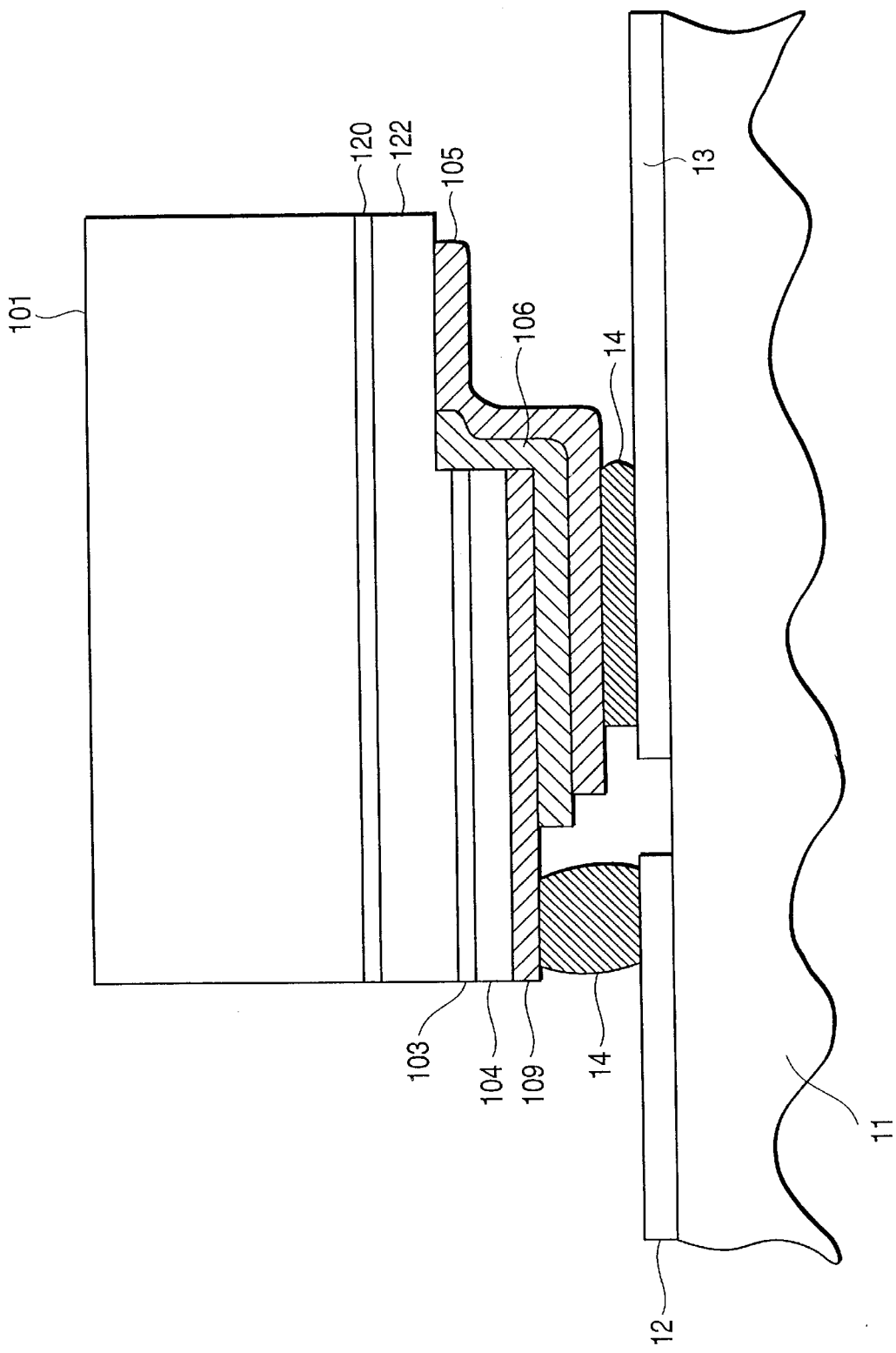
FIG. 9 shows a sectional view of a flip flop mounting type LED according to a seventh illustrative embodiment of the present invention.

FIG. 9 shows an exemplary LED structure of a flip flop mounting type according to the present invention. A buffer layer 120 of InAlGaN at a thickness of about 10–200 nm is formed on a sapphire substrate 101. The DH structure has a first contact layer 122 which is an n-type GaN layer having a thickness of about 4 µm, an active layer 103 which includes an In$_{0.3}$Ga$_{0.7}$N well layer doped with Si at a thickness of about 2.5 nm and a p-Al$_{0.2}$Ga$_{0.8}$N cap layer at a thickness of about 40 nm, and a second contact layer 104 which is a p-type GaN layer at a thickness of about 0.5 µm. A step is formed by partly etching the second contact layer 104, the active layer 103 and a shallow portion of the first contact layer 122. A second electrode 109 of a metal such as Ti, Au, Ni, an Au-Ti alloy, an Au-Al alloy, or an Au-Cu alloy is formed on the second contact layer 104.

After an insulating layer 106 of SiO$_2$ is formed on the second electrode 109 and the surface of the step, an area for a first electrode 105 and an area for connecting to a wiring board 11 are exposed by conventional etching. The first electrode 105 of an AuGe alloy is formed on the first contact layer 122 and the insulating layer 106 to form a capacitor Cex between the first electrode 105 and the second electrode 109. The first electrode 105 and the second electrode 109 are connected to wiring lines 12, 13 on the wiring board 11 by solder 14.

The light emitted from the active layer 103 passes through the substrate 101. The light emitted to the second electrode 109 is reflected and passes through the substrate 101 also.

The surge resistance improves because the capacitance of the diode as a whole is increased by forming a capacitor Cex on the light emitting element. Because the light is emitted from the substrate 101, a large area capacitor having a large capacitance can be formed on the element without a loss of light. The bonding is easy because the spaces for solder 14 are reserved sufficiently and the difference in the height between the first electrode 105 and the second electrode 109 is small. The insulator layer 106 preferably has a thickness of about 0.01–1 µm for SiO$_2$, but it can be 1 µm or more by using a high dielectric material such as BSTO, BTO or STO.

This embodiment of the present invention is not limited to the GaN-based LED and can also be applied to GaAlAs-based and other LEDs regardless of homo-junction, single hetero-junction (SH junction) or DH junction types.

Embodiment 8

Figure 10:
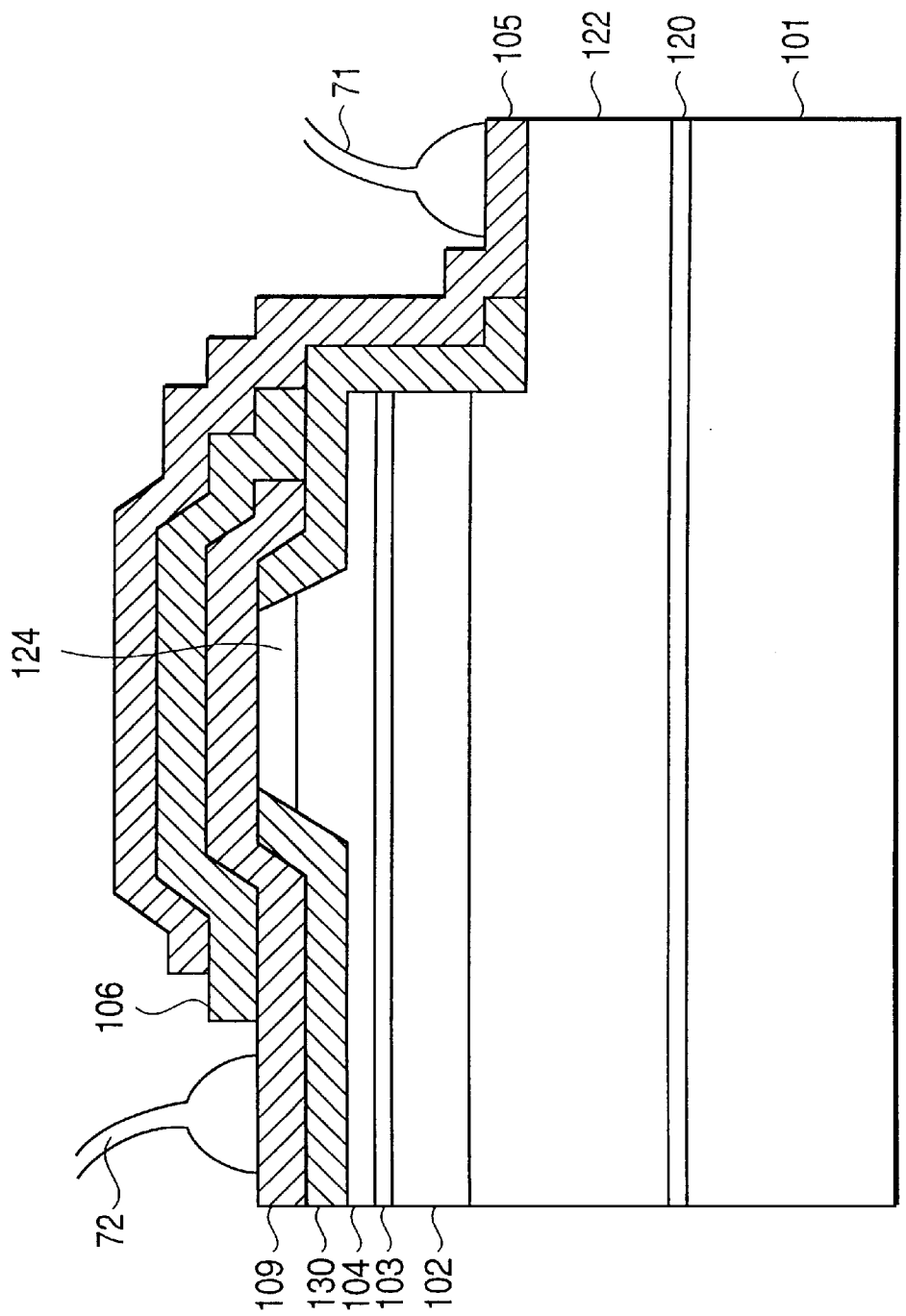
FIG. 10 shows a sectional view of an LD according to a eighth illustrative embodiment of the present invention.

FIG. 10 is a perspective view showing the outline of an illustrative blue semiconductor laser diode according to the present invention. As shown in FIG. 10, the blue LD has a first contact layer 122 of n-type GaN having a thickness of about 4 µm formed on a buffer layer 120 of InAlGaN having a thickness of about 10–200 nm on a sapphire substrate 101 having a (0001) surface, a first cladding layer 102 of n-type Al$_{0.15}$Ga$_{0.85}$N having a thickness of about 300 nm on the first contact layer 122, and an active layer 103 on the first cladding layer 102. The active layer 103 includes an undoped GaN layer having a thickness of about 100 nm, 10 pairs of an undoped In$_{0.2}$Ga$_{0.8}$N layer having a thickness of about 2 nm and an undoped In$_{0.5}$Ga$_{0.95}$N layer having a thickness of about 4 nm, a p-type Al$_{0.2}$Ga$_{0.8}$N layer doped with Mg having a thickness of about 40 nm and a p-type GaN layer doped with Mg having a thickness of about 100 nm. A second cladding layer 104 of p-type Ga$_{0.85}$Al$_{0.15}$N doped with Mg having a thickness of about 300 nm is formed on the active layer 103. A second contact layer 124 of p-type GaN doped with Mg having a thickness of about 0.5 µm is formed on the second cladding layer 104.

A ridge of the second contact layer 124 and the cladding layer 104 having about a 3 µm width and a step to expose the first contact layer 122 are formed by a conventional etching method such as RIE. An insulating layer 130 is formed on the ridge and the step. After a contact area is exposed on the second contact layer 124, a second electrode 109 of Ni, Au, Ti, an alloy of Au and Ti, an alloy of Au and Al, or an alloy of Au and Cu is formed on the ridge. An insulating layer 106 of SiO$_2$ or the like having a thickness of about 0.01–1 µm is formed on the second electrode 109 and a first electrode 105 of Ti, Au or an alloy thereof is formed on the first cladding layer 102 and the insulating layer 106. A capacitor Cex is formed by the second electrode 109, the insulator layer 106 and the first electrode 105 on the ridge. When a high dielectric material or strong dielectric material such as BTO, BSTO, STO or PZT is selected as the insulating layer, a surge resistance of several kV or more can be obtained.

This embodiment of the present invention is not limited to the GaN-based LD and can also be applied to GaAlAs-based and other LDs regardless of homo-junction, single hetero-junction (SH junction) or DH junction types.

Embodiment 9

Figure 11:
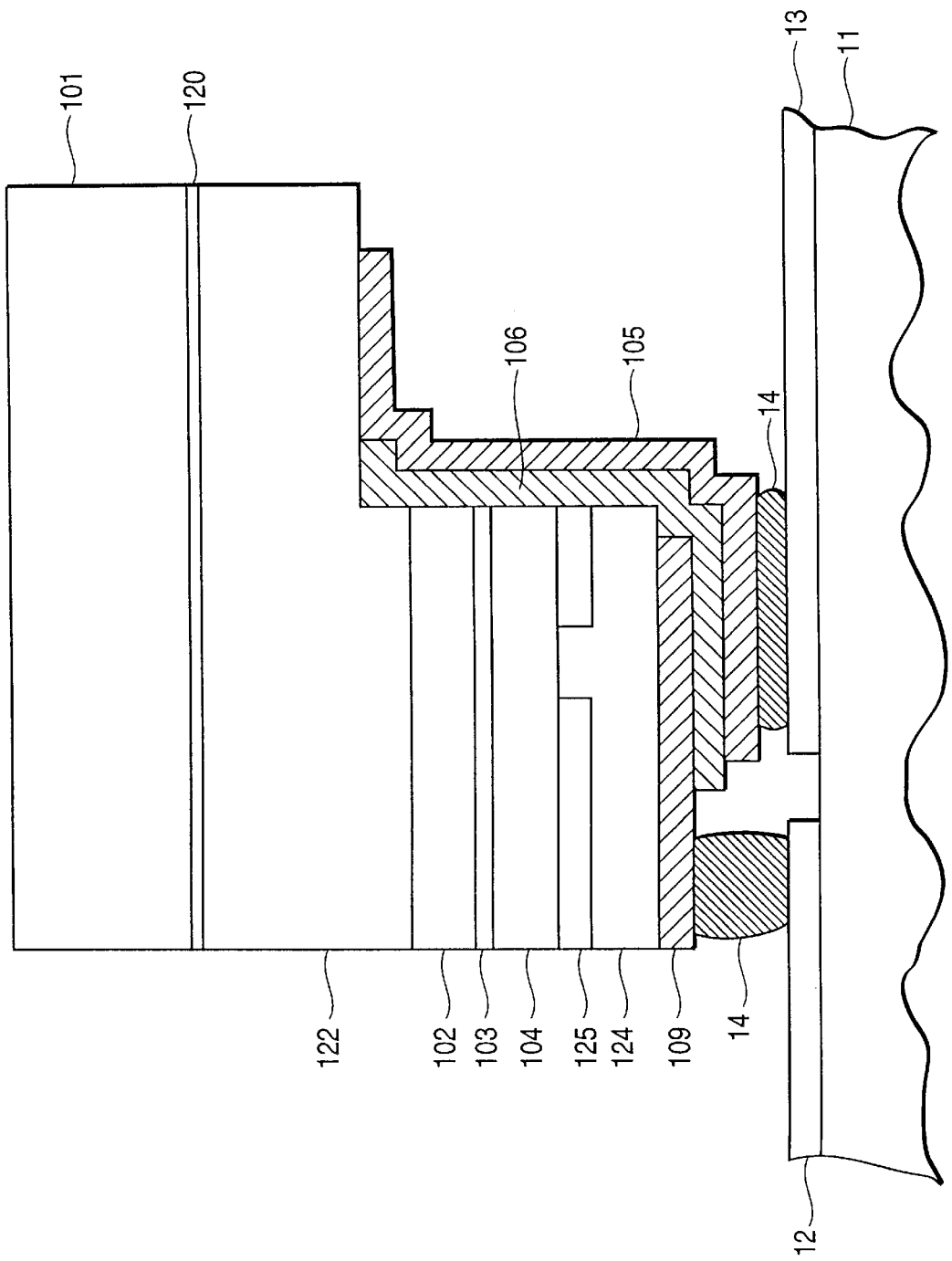
FIG. 11 shows a sectional view of a flip flop mounting type ID according to a ninth illustrative embodiment of the present invention.
Figure 12A:
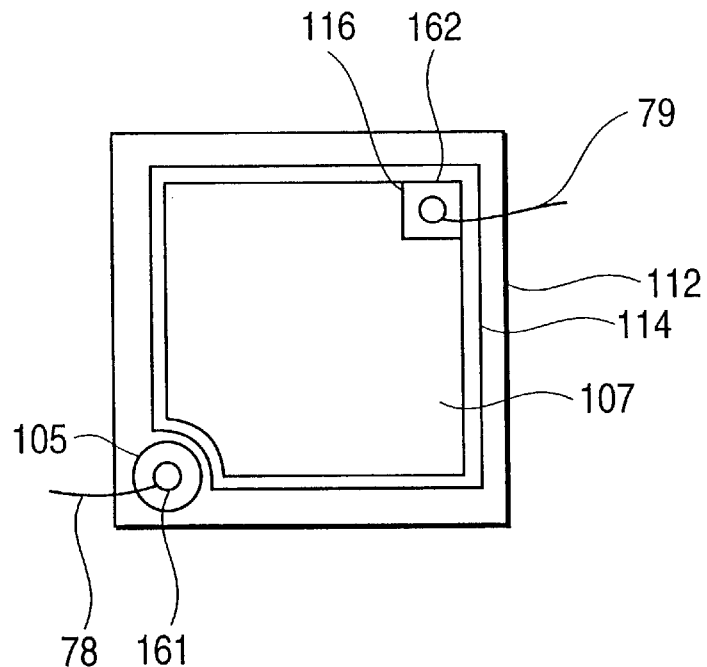
FIGS. 12(a) and 12(b) show the structure of a conventional blue LED.
Figure 12B:
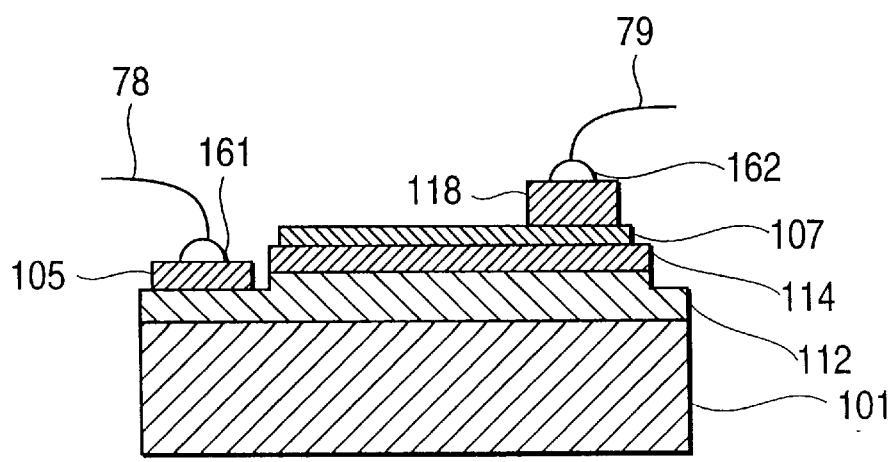

FIG. 11 is a perspective view showing the outline of a blue semiconductor laser diode according to an illustrative embodiment of the present invention. As shown in FIG. 11, the blue LD has a buffer layer 120 of InAlGaN having a thickness of about 10–200 nm on a sapphire substrate 101 having a (0001) surface, a first contact layer 122 of an N-type GaN doped with Si having a thickness of about 4 µm on the buffer layer 120, a first cladding layer 102 of N-type Ga$_{0.85}$Al$_{0.15}$N having a thickness of about 300 nm on the first contact layer 122, and an active layer 103 on the first cladding layer 102. The active layer 103 includes an undoped GaN layer having a thickness of about 100 nm, 10 pairs of an undoped In$_{0.2}$Ga$_{0.8}$N layer having a thickness of about 2 nm and an undoped In$_{0.05}$Ga$_{0.95}$N layer having a thickness of about 4 nm, a p-type Al$_{0.2}$Ga$_{0.8}$N layer doped with Mg having a thickness of about 40 nm and a p-type GaN layer doped with Mg having a thickness of about 100 nm. A second cladding layer 104 of p-type Ga$_{0.85}$Al$_{0.15}$N doped with Mg having a thickness of about 300 mn is formed on the active layer 103. Current block layers 125 of n-type GaN doped with Si having a thickness of about 1.5 µm are formed on the second cladding layer 104. The current block layers 125 have an opening with a width of about 3 µm formed by RIE. A second contact layer 124 of p-type GaN doped with Mg having a thickness of about 1 µm on the second cladding layer 104 and the current block layers 125 is formed. A step is formed by partly etching the second contact layer 124, the current block layer 125, the second cladding layer 104, the active layer 103, the first cladding layer 102 and a shallow portion of the first contact layer 122.

A second electrode 109 of Ni, Au, Ti or an alloy of Au and Ti, Al, or Cu is formed on the second contact layer 124. After an insulator layer 106 of SiO$_2$ or the like having a thickness of about 0.01–1 μm is formed on the side wall of the step and the second electrode 109 except for an area for the second electrode 109 to contact wiring line 12 on a wiring board 11, a first electrode 105 of Ti, Au or alloy thereof is formed on the insulating layer 106 and connected to the first contact layer 122. A capacitor Cex is formed among the second electrode 109, the insulator layer 106 and the first electrode 105. When a high dielectric material or strong dielectric material such as BTO, BSTO, STO or PZT is selected as the insulating layer, a surge resistance of several kV or more can be obtained. The thickness of the insulating layer 106 can be 1 μm or more by using a high dielectric material.

The first electrode 105 and the second electrode 109 are connected to the wiring lines 12, 13 on the wiring board 11 by solder 14. The wiring board 11 can function as a heat sink. The bonding is easy because the spaces for solder 14 are reserved sufficiently and the difference in the height between the first electrode 105 and the second electrode 109 is small, and the heat of the emitting element flows to the wiring board 11 easily.

This embodiment of the present invention is not limited to the GaN-based LD and can also be applied to GaAlAs-based and other LDs regardless of homo-junction, single heterojunction (SH junction) or DH junction types.

While there has been shown and described various embodiments of the present invention it will be evident to those skilled in the art that various modifications may be made thereto without departing from the scope of the invention which is set forth in the appended claims.

What is claimed is:

1. A compound semiconductor light emitting device comprising:
   a compound semiconductor light emitting element having a first contact area and a second contact area;
   a first electrode coupled to said first contact area;
   a second electrode coupled to said second contact area; and an insulating layer for separating said first and said second electrodes in a region in which one of said first or said second electrodes overlaps the other of said first or said second electrodes, wherein a capacitor element includes said insulating layer, said first electrode and said second electrode.

2. A compound semiconductor light emitting device according to claim 1, wherein said compound semiconductor light emitting element comprises an In$_x$Al$_y$Ga$_{(1-x-y)}$N layer (0≦x≦1, 0≦y≦1).

3. A compound semiconductor light emitting device according to claim 2, further comprising:
   a substrate on which said semiconductor light emitting element is formed, wherein emitted light passes through said substrate.

4. A compound semiconductor light emitting device according to claim 1, wherein a capacitance of said capacitor is greater than an intrinsic capacitance of said compound semiconductor light emitting element.

5. A compound semiconductor light emitting device comprising:
   a first compound semiconductor layer of a first conductivity type;
   a second compound semiconductor layer of a second conductivity type formed on said first compound semiconductor layer;
   a first electrode connected to said first compound semiconductor layer;
   a second electrode connected to said second compound semiconductor layer, and
   an insulating layer formed on one of said first or said second compound semiconductor layers for separating said first and said second electrodes in a region in which one of said first or said second electrodes overlaps the other of said first or said second electrodes, wherein a capacitor includes said insulating layer, said first electrode and said second electrode.

6. A compound semiconductor light emitting device according to claim 5, further comprising an active layer formed between said first compound semiconductor layer and said second compound semiconductor layer.

7. A compound semiconductor light emitting device according to claim 6, wherein at least one of said first compound semiconductor layer, said active layer and said second compound semiconductor layer includes an In$_x$Al$_y$Ga$_{(1-x-y)}$N layer (0≦x≦1, 0≦y≦1).

8. A compound semiconductor light emitting device according to claim 6, further comprising a trench formed in said first compound semiconductor layer, said active layer and said second compound semiconductor layer, wherein said insulating layer is formed on a side wall of said trench.

9. A compound semiconductor light emitting device according to claim 5, wherein said first compound semiconductor layer and said second compound semiconductor layer include InxAlyGa(1-x-y)N layers (0≦x≦1, 0≦y≦1).

10. A compound semiconductor light emitting device according to claim 5, further comprising a reflective layer formed under said first compound semiconductor layer.

11. A compound semiconductor light emitting device according to claim 5, wherein said second electrode includes a transparent electrode and an electrode wiring.

12. A compound semiconductor light emitting device according to claim 11, wherein said electrode wiring is selected from a group consisting of Au, Ti, Ni, an alloy of Au and Ti, an alloy of Au and Al, and an alloy of Au and Cu.

13. A compound semiconductor light emitting device according to claim 5, wherein said first compound semiconductor layer includes a portion forming a bottom of a step, said second compound semiconductor layer having been removed therefrom or not formed thereon, the overlap region of said insulating layer being formed on the bottom of said step.

14. A compound semiconductor light emitting device according to claim 13, wherein said insulating layer covers a side wall of said step.

15. A compound semiconductor light emitting device according to claim 5, wherein said first electrode or said second electrode includes a wiring layer.

16. A compound semiconductor light emitting device according to claim 5, wherein said insulating layer includes a material selected from a group consisting of SiO$_2$, Ta$_2$O$_5$, BTO, STO, BSTO and PZT.

17. A compound semiconductor light emitting device according to claim 5, wherein said first electrode and said second electrode serve as bonding pads.

18. A compound semiconductor light emitting device according to claim 5, wherein said insulating layer is disposed between said first compound semiconductor layer and said second electrode, and said capacitor is formed between said first compound semiconductor layer and said second electrode.

19. A compound semiconductor light emitting device according to claim 5, wherein said capacitor is formed between said first compound semiconductor layer and said second electrode, and a Schottky barrier is formed between said first compound semiconductor layer and said second electrode.

20. A compound semiconductor light emitting device according to claim 5, wherein said first compound semiconductor layer includes a portion forming a bottom of a step, said second compound semiconductor layer having been removed therefrom or not formed thereon, said second electrode being formed on a top of said step, and the overlap region of said insulating layer being formed on said second electrode.

21. A compound semiconductor light emitting device according to claim 5, further comprising:
a wiring board having wiring lines on the surface thereof: and
a conductive paste for connecting said first electrode and said second electrode to said wiring lines.

22. A compound semiconductor light emitting device comprising:
a first contact layer made of a first compound semiconductor layer of a first conductivity type;
a first cladding layer made of a second compound semiconductor layer of the first conductivity type and formed on a first portion of said first contact layer;
an active layer formed on said first cladding layer;
a second cladding layer made from a third compound semiconductor layer of a second conductivity type and formed on said active layer;
a current block formed on said second cladding layer;
a third cladding layer made from a fourth compound semiconductor layer of the second conductivity type, said third cladding layer being adjacent to said current block and formed on said second cladding layer;
a second contact layer formed on said third cladding layer;
a first electrode connected to a second portion of said first contact layer;
an insulating layer formed on said first electrode; and
a second electrode connected to said second contact layer, said second electrode extending over a portion of said insulating layer which overlays said first electrode, wherein a capacitor is formed of elements including said first electrode, said insulator layer and said second electrode.

23. A compound semiconductor light emitting device according to claim 22, wherein said device includes an $In_xAl_yGa_{(1-x-y)}N$ layer ($0 \leq x \leq 1$, $0 \leq y \leq 1$).

24. A compound semiconductor light emitting device according to claim 22, wherein a material of at least one of said first and second electrodes is selected from a group consisting of Au, Ti, Ni, an alloy of Au and Ti, an alloy of Au and Al, and an alloy of Au and Cu.

25. A compound semiconductor light emitting device according to claim 22, wherein said first electrode and said second electrode serve as bonding pads.

26. A compound semiconductor light emitting device according to claim 22, further comprising:
a wiring board having wiring lines on the surface thereof; and
a conductive paste for connecting said first electrode and said second electrode to said wiring lines.

27. A compound semiconductor light emitting device comprising:
a first contact layer made from a first compound semiconductor layer of a first conductivity type;
a first cladding layer made from a second compound semiconductor layer of the first conductivity type and formed on said first contact layer;
an active layer formed on said first cladding layer;
a second cladding layer made from a third compound semiconductor layer of a second conductivity type on said active layer;
a current block on said second cladding layer;
a third cladding layer made from a fourth compound semiconductor layer of the second conductivity type and adjacent to said current block and formed on said second cladding layer;
a second contact layer on said third cladding layer;
a first electrode connected to said first contact layer;
a second electrode connected to said second contact layer; and
an insulating layer formed on one of said first or said second contact layers for separating said first and said second electrodes in a region in which one of said first or said second electrodes overlaps the other of said first or said second electrodes, wherein a capacitor includes said insulating layer, said first electrode and said second electrode.

28. A compound semiconductor light emitting device comprising:
a first contact layer made from a first compound semiconductor layer of a first conductivity type;
a first cladding layer made from a second compound semiconductor layer of the first conductivity type and formed on said first contact layer;
an active layer formed on said first cladding layer;
a second cladding layer made from a third compound semiconductor layer of a second conductivity type on said active layer;
a current block on said second cladding layer;
a second contact layer made from a fourth compound semiconductor layer of the second conductivity type on said second cladding layer;
a first electrode connected to said first contact layer;
a second electrode connected to said second contact layer; and
an insulating layer formed on one of said first or said second contact layers for separating said first and said second electrodes in a region in which one of said first or said second electrodes overlaps the other of said first or said second electrodes, wherein a capacitor includes said insulating layer said first electrode and said second electrode.

29. A compound semiconductor light emitting device according to claim 28, wherein said current block is a dielectric layer.

30. A compound semiconductor light emitting device according to claim 29, wherein said dielectric layer comprises $SiO_2$.

31. A compound semiconductor light emitting device according to claim 28, wherein said capacitor is formed on said second electrode on said second contact layer.

32. A compound semiconductor light emitting device according to claim 28, wherein at least one of said first contact layer, said first cladding layer, said active layer, said second cladding layer, said current block and said second contact layer includes an $In_xAl_yGa_{(1-x-y)}N$ layer ($0 \leq x \leq 1$, $0 \leq y \leq 1$).

33. A compound semiconductor light emitting device comprising:
a ceramic substrate;
a compound semiconductor light emitting element mounted on said ceramic substrate, and having a first electrode and a second electrode;

a first wiring layer coupled to said first electrode;

a second wiring layer coupled to said second electrode;

an insulating layer, coupled to said ceramic substrate, for separating said first and said second wiring layers in a region in which one of said first or said second wiring layers overlaps the other of said first or said second wiring layers, wherein a capacitor element includes said insulating layer, said first electrode and said second electrode.

34. A compound semiconductor light emitting device comprising:

a first contact layer made of a first compound semiconductor layer of a first conductivity type;

a first cladding layer made of a second compound semiconductor layer of the first conductivity type and formed on a first portion of said first contact layer;

an active layer formed on said first cladding layer;

a second cladding layer made from a third compound semiconductor layer of a second conductivity type and formed on said active layer;

a current block formed on said second cladding layer;

a third cladding layer made from a fourth compound semiconductor layer of the second conductivity type, said third cladding layer being adjacent to said current block and formed on said second cladding layer;

a second contact layer formed on said third cladding layer;

a first electrode connected to a second portion of said first contact layer;

a second electrode connected to said second contact layer, and an insulating layer formed on said second electrode, wherein said first electrode extends over a portion of said insulating layer which overlays said second electrode, and a capacitor includes said insulating layer, said first electrode and said second electrode.

35. A compound semiconductor light emitting device comprising:

a substrate;

a compound semiconductor light emitting element formed on said substrate having a first contact area and a second contact area;

a first electrode coupled to said first contact area;

a second electrode coupled to said second contact area; and an insulating layer for separating said first and said second electrodes in a region in which one of said first or said second electrodes overlaps the other of said first or said second electrodes, wherein a capacitor element includes said first electrode and said second electrode.

36. A compound semiconductor light emitting device comprising:

a substrate;

a first compound semiconductor layer of a first conductivity type formed on said substrate;

a second compound semiconductor layer of a second conductivity type formed on said first compound semiconductor layer;

a first electrode connected to said first compound semiconductor layer;

a second electrode connected to said second compound semiconductor layer, and an insulating layer formed on one of said first or said second compound semiconductor layers for separating said first and said second electrodes in a region in which one of said first or said second electrodes overlaps the other of said first or said second electrodes, wherein a capacitor includes said first electrode and said second electrode.

* * * * *